United States Patent
Ricketson

(10) Patent No.: US 7,380,581 B2
(45) Date of Patent: Jun. 3, 2008

(54) TAPE FEEDER AND TAPE FEEDING AND RECOVERING MODULES THEREFOR

(75) Inventor: Tommy Howard Ricketson, Plumsteadville, PA (US)

(73) Assignee: Samsung Techwin Co., Ltd., Changwon (KR)

( * ) Notice: Subject to any disclaimer, the term of this patent is extended or adjusted under 35 U.S.C. 154(b) by 373 days.

(21) Appl. No.: 11/043,832

(22) Filed: Jan. 26, 2005

(65) Prior Publication Data

US 2006/0162868 A1    Jul. 27, 2006

(51) Int. Cl.
*B65H 5/28* (2006.01)
(52) U.S. Cl. .................. 156/584; 156/344; 221/25; 221/79; 221/87; 414/416.05
(58) Field of Classification Search ............... 156/344, 156/584; 221/25, 72, 73, 79, 87; 414/411, 414/416.01, 416.03, 416.05, 416.08, 425, 414/811
See application file for complete search history.

(56) References Cited

U.S. PATENT DOCUMENTS

| | | | | |
|---|---|---|---|---|
| 4,586,670 A | * | 5/1986 | Vancelette et al. ........... | 156/584 |
| 6,379,098 B1 | * | 4/2002 | Shibasaki .............. | 414/416.01 |
| 6,695,032 B2 | * | 2/2004 | Kim ........................... | 156/582 |
| 7,052,564 B2 | * | 5/2006 | Tandle et al. ................. | 156/64 |
| 2003/0179553 A1 | * | 9/2003 | Endo et al. ................. | 361/752 |

* cited by examiner

*Primary Examiner*—Mark A Osele
(74) *Attorney, Agent, or Firm*—Drinker Biddle & Reath LLP

(57) ABSTRACT

Provided are tape feeding and recovering modules for a tape feeder, and a tape feeder including the tape feeding module and the recovering module. The tape feeding module feeds a tape storing a plurality of electronic components in a predetermined pitch by driving a sprocket which inserts its teeth into the tape. And the recovering module exposes the plurality of electrical components by removing a top cover from a top surface of the tape and discharges the top cover from the tape feeder.

8 Claims, 7 Drawing Sheets

TAPE FEEDER AND TAPE FEEDING AND RECOVERING MODULES THEREFOR

BACKGROUND OF THE INVENTION

1. Field of the Invention

The present invention relates to tape feeding and recovering modules for use in a tape feeder of an electronic component mounting apparatus, and a tape feeder including the tape feeding and recovering modules.

2. Description of the Related Art

Electronic component mounting apparatuses automatically mount electronic components on a circuit substrate. Electronic component mounting apparatuses carry out a series of mounting operations by picking up electronic components from a component supplying unit, moving the electronic components above a circuit substrate and mounting the electronic components on top of the circuit substrate. The component supplying unit includes a plurality of tape feeders mounted on a feeder base at predetermined intervals. As is known in the surface mount technology (SMT) art, such tape feeders remove a top cover from a tape that stores electronic components (e.g., integrated circuit chips), thereby allowing a mounting head (e.g., a vacuum nozzle) to pick up the exposed electronic components from the tape and deposit the picked-up electronic components on a circuit substrate (e.g., PCB).

FIG. 1 is a view of a tape feeder disclosed in Korean Patent Laid-Open No. 2004-35396. The tape feeder includes a frame 10, a tape transporter 50 that is mounted on one part of the frame 10, a top cover recovering element 70 that is mounted on another part of the frame 10, and a power element 80 that provides power to the tape transporter 50 and the top cover recovering element 70. As shown in FIG. 1, the tape transporter 50 drives a sprocket 30 that feeds a tape 1 to a location where an electronic component 4 is to be picked up (i.e., a location proximate a mounting head 200). Further, the top cover recovering element 70 drives a first recovering gear 61 to output a top cover 3, which is removed from the top surface of the tape 1.

Transporting holes (i.e., where teeth of the sprocket 30 are inserted) are formed on both of the right and left sides of the tape 1. The tape transporter 50 drives the sprocket 30 to transport the tape 1 to the location where an electronic component 4 on the tape 1 (e.g., in a pocket of the tape 1) is to be picked up via a mounting head 200. The tape transporter 50 includes a feeding worm wheel 51 fixed to the sprocket 30 and a feeding power transmitter 52 having a feeding worm gear 52a formed on one end thereof. The feeding worm gear 52a is meshed with the feeding worm wheel 51 to turn the sprocket 30. A first driving gear 52b meshed with a power gear of the power element 80 is formed on the opposite end of the feeding power transmitter 52. That is, feeding worm gear 52a and first driving gear 52b are disposed on opposing ends of the feeding power transmitter 52.

The top cover 3, which is attached to the top surface of the tape 1, is peeled from the tape 1 via the first recovering gear 61 and a second recovering gear 62 before the electronic component 4 reaches the pickup location. The top cover 3 is held between the first and second recovering gears 61, 62, which are formed on another part of the frame 10 distal from the tape transporter 50, so that the top cover 3 is discharged from the tape feeder by rotating the first and second recovering gears 61, 62. As can be appreciated from FIG. 1, the tape 1 is fed from a storage location (not shown) and moved first upwards and counterclockwise toward a shutter 20 by the tape transporter 50 driving sprocket 30 such that as the tape 1 moves along the shutter 20 the top cover 3 is separated from the tape 1 (e.g., by a direction conversion slot or the like) and fed away from the pick up location via the recovering element 70 and recovering gears 61, 62. Thus, the electronic components 4 stored on the tape 1 are transported to the pickup location with the top cover 3 removed from the tape 1 and are picked up at the pickup location by the mounting head 200. The first recovering gear 61 receives power from first and second recovering power transmitters 71 and 72 that are coupled to each other. In more detail, a second driving gear 71a that is coupled with a power gear of the power element 80 through a first driving gear 52b is formed on one end of the first recovering power transmitter 71, and a second worm gear 71b that is coupled with the second recovering power transmitter 72 is formed on the opposite end of the first recovering power transmitter 71. The second recovering power transmitter 72 includes a worm wheel 72a that is meshed with the worm gear 71b and an intermediary gear 72b to which the worm wheel 72a is fixed. Thus, in response to the worm gear 71b and worm wheel 72a, the intermediary gear 72b drives the first receiving gear 61. As shown, the tape feeder further includes a rotation speed detector 90 mounted on the same axis as the feeding power transmitter 52 to detect the rotation speed of the power element 80. The tape feeder also includes a shutter 20 that exposes one of the electronic components 4, thereby allowing the mounting head 200 to picks up the electronic component 4.

However, since the conventional tape feeder has a complex driving mechanism as described-above, designing and manufacturing a tape feeder is difficult. Particularly, by having a tape feeder structure in which a plurality of components are assembled, individually mounted on a frame, aligned and tested, the number of manhours required to assemble the tape feeder is great thereby increasing the cost of the finished tape feeder.

The width of a tape supplied to a tape feeder varies according to the type of electronic components stored on the tape. Therefore, a tape feeder needs to be selected according to the width of the tape to be fed. However, in conventional tape feeders, components are manufactured with different specifications according to the widths of the tape feeders even if the functions of the components do no change from tape feeder to tape feeder, and the arrangements of the components are also different according to the type of the tape feeders. This results in an increase in the number of types of components that are used in the tape feeders, and causes a waste of resources and manhours.

Moreover, since the conventional tape feeder is assembled from a plurality of interconnected components, man-hours and costs required for the maintenance and repair of the tape feeder are increased. For example, one can appreciate that it may be easier or more efficient to replace the entire tape feeder instead of repairing it since the tape transporter 50 and the top cover recovering element 70 are coupled together and commonly driven by the power source 80. Also, when repair of the tape feeder is delayed, the efficiency of the SMT operation is decreased.

Therefore, in view of the foregoing, a tape feeder wherein the tape transporter and the recovering element are modular would be desirable.

SUMMARY OF THE INVENTION

The present invention provides a tape feeder with a modular construction, and tape feeding and recovering modules therefor.

One embodiment of the present invention also provides a tape feeding module and a recovering module for a tape feeder that have substantially identical structures, and a tape feeder having the substantially identical tape feeding and recovering modules.

According to an aspect of the present invention, there is provided a tape feeding module for a tape feeder that feeds a tape, which stores electronic components, in a predetermined pitch by driving a sprocket that inserts its teeth into the tape. The tape feeding module includes: a module housing; a driving motor disposed at one part of the module housing; a mounting axis disposed at another part of the module housing and coupled to the sprocket; and a transmission that transfers power between the driving motor and the mounting axis to drive the sprocket.

According to another aspect of the present invention, there is provided a recovering module for a tape feeder. The recovering module discharges a top cover, which is attached to a top surface of a tape, by driving at least one of a pair of recovering gears so that the top cover passes between the recovering gears and is discharged. The recovering module includes: a module housing; a driving motor mounted on one part of the module housing; a mounting axis formed on another part of the module housing and on which the recovering gear is mounted; and a transmission that transfers power between the driving motor and the mounting axis to drive the at least one recovering gear.

According to another aspect of the present invention, there is provided a tape feeder that removes a top cover attached to top of a tape storing electronic components while feeding the tape in a predetermined pitch and allows the electronic components to be sequentially picked up by a mounting head. The tape feeder includes: a frame; a tape feeding module that is mounted on one part of the frame and has a sprocket mounted thereon, teeth of the sprocket being inserted in the tape to feed the tape; and a recovering module that is mounted on another part of the frame and includes one of a pair of recovering gears mounted on the recovering module to remove the top cover, the pair of recovering gears discharging the top cover attached to the top of the tape by placing the top cover between the recovering gears.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
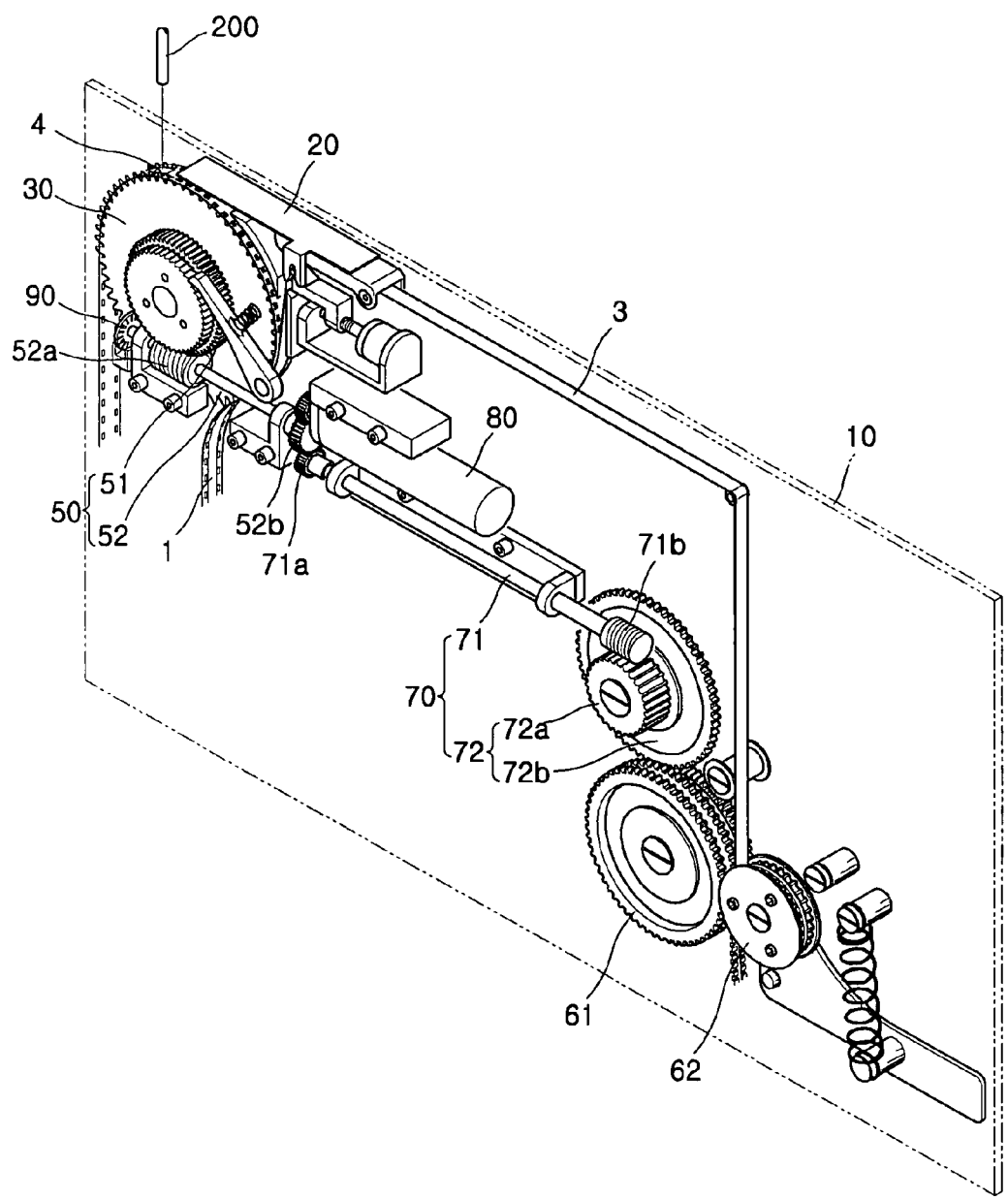
FIG. 1 is a perspective view of a conventional tape feeder.
Figure 2:
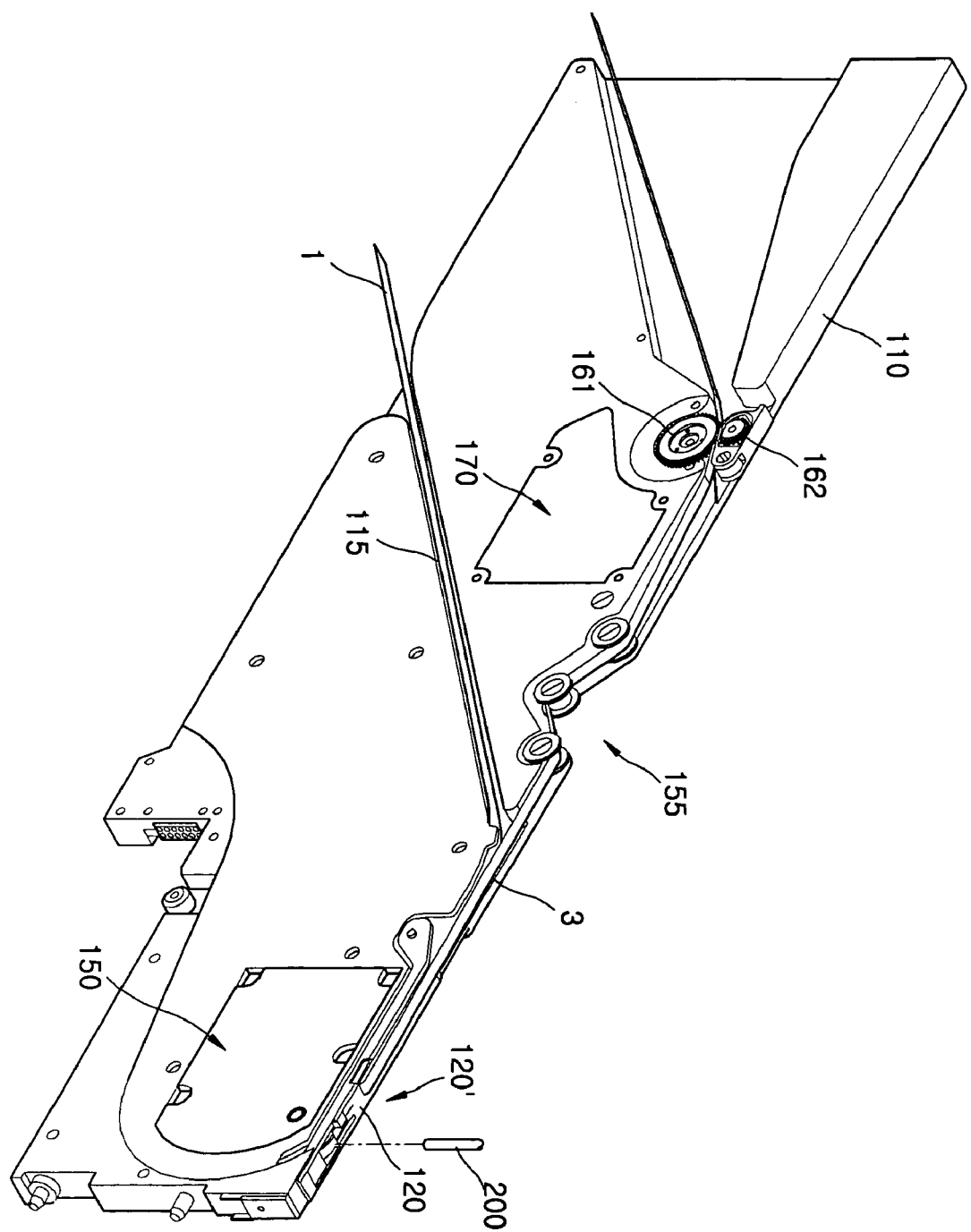
FIGS. 2 and 3 are perspective side views of a tape feeder according to an embodiment of the present invention.
Figure 3:
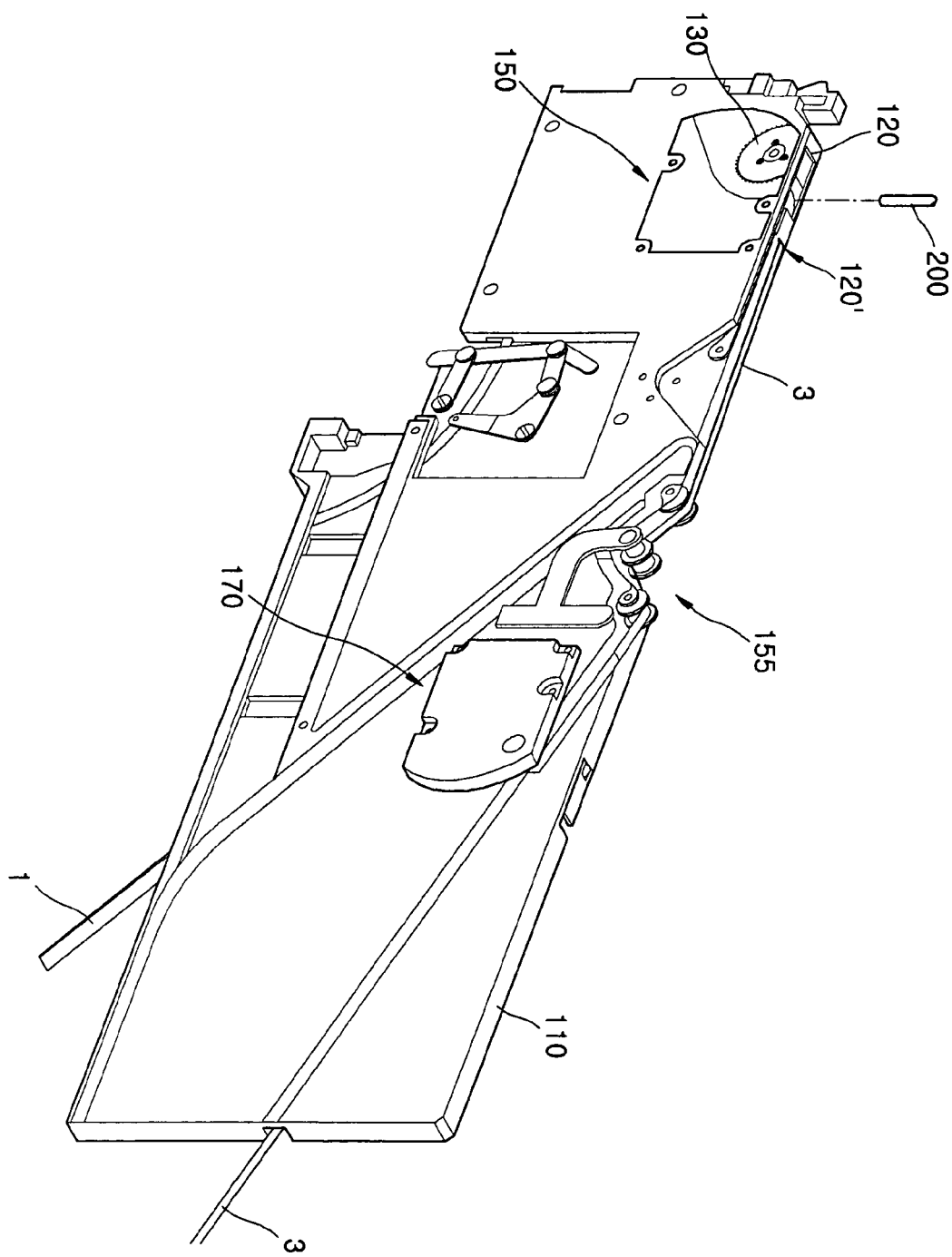

FIGS. 2 and 3 are perspective views of two sides of a tape feeder according to an embodiment of the present invention. The tape feeder includes a frame 110 that directly or indirectly serves to support the remaining components of the tape feeder. That is, as shown in FIGS. 2 and 3, the frame 110 supports: a tape feeding module 150 comprising a sprocket 130 that feeds a tape 1; a recovering module 170 comprising a recovering gear 161 that cooperates with a second recovering gear 162 to recover a top cover 3, which covers the top surface of the tape 1, in a direction which is the opposite to the direction the tape 1 is fed; and recovering guides 155 that guide the top cover 3 away from the tap 1 and toward the recovering gears 161, 162. Although not shown in the drawing, one can appreciate that a components reel, spool or the like on which the tape 1 having the plurality of electronic components may be mounted on the frame 110 so that the electronic components on the tape 1 are transported to a pickup location by the sprocket 130 for picking up by a mounting head 200. As shown in FIG. 2, the tape 1 is transported to the bottom of a tape guide 120 through a feeding guide 115. The sprocket 130 (FIG. 3) is driven by the tape feeding module 150, which has a modular construction that facilitates assembly and disassembly of the module 150 to the frame 110. The tape feeding module 150 will be described hereafter in more detail.

A direction conversion slot 120' is formed on the tape guide 120 so that as the tape 1 passes along the tape guide 120, the top cover 3 is separated from the top surface of the tape 1 by the direction conversion slot 120' and is transported in a direction opposite to the direction in which the tape 1 is fed. In more detail, the top cover 3 is transported to another part of the frame 110 via the recovering guides 155 and by passing through the pair of recovering gears 161, 162 so that the top cover 3 is discharged away from the tape feeder. The recovering guides 155 may be rollers to reduce friction on the top cover 3. Alternatively, the recovering guides 155 may be low-friction stationary pins, rods or the like. The top cover 3 is moved by the first and second recovering gears 161 and 162 after traveling through the recovering guides 155. As best illustrated in FIG. 2, the top cover 3 is threaded or woven between the three guides 155 such that the cover 3 contacts the upper surfaces of the outer guides and contacts the lower surface of the inner guide. In this way the guides 155 and recovering gears 161, 162 apply a predetermined tension to the top cover 3, thus preventing stretching or twisting of the top cover 3.

The pair of recovering gears includes first and second recovering gears 161 and 162 that mesh with each other. The first recovering gear 161 is driven by a recovering module 170. Similar to the tape feeding module 150, the recovering module 170 has a modular construction that facilitates assembly and disassembly of the module 170 to the frame 110. The recovering module 170 will be described hereafter in more detail. As best illustrated in FIG. 2, the second recovering gear 162 is affixed to the frame 110 and is meshed with the first recovering gear 161, thus rotating when the first recovering gear 161 is driven by the recovering module 170. As shown in FIG. 2, the top cover 3 is output from the tape feeder after being compressed between the first and second recovering gears 161 and 162. As the top cover 3 is removed from the tape 1 in the tape feeding process, the electronic components stored in the tape 1 are sequentially exposed so that the exposed electronic components can be picked up by the mounting head 200 for mounting on a circuit substrate (not shown).

Figure 4:
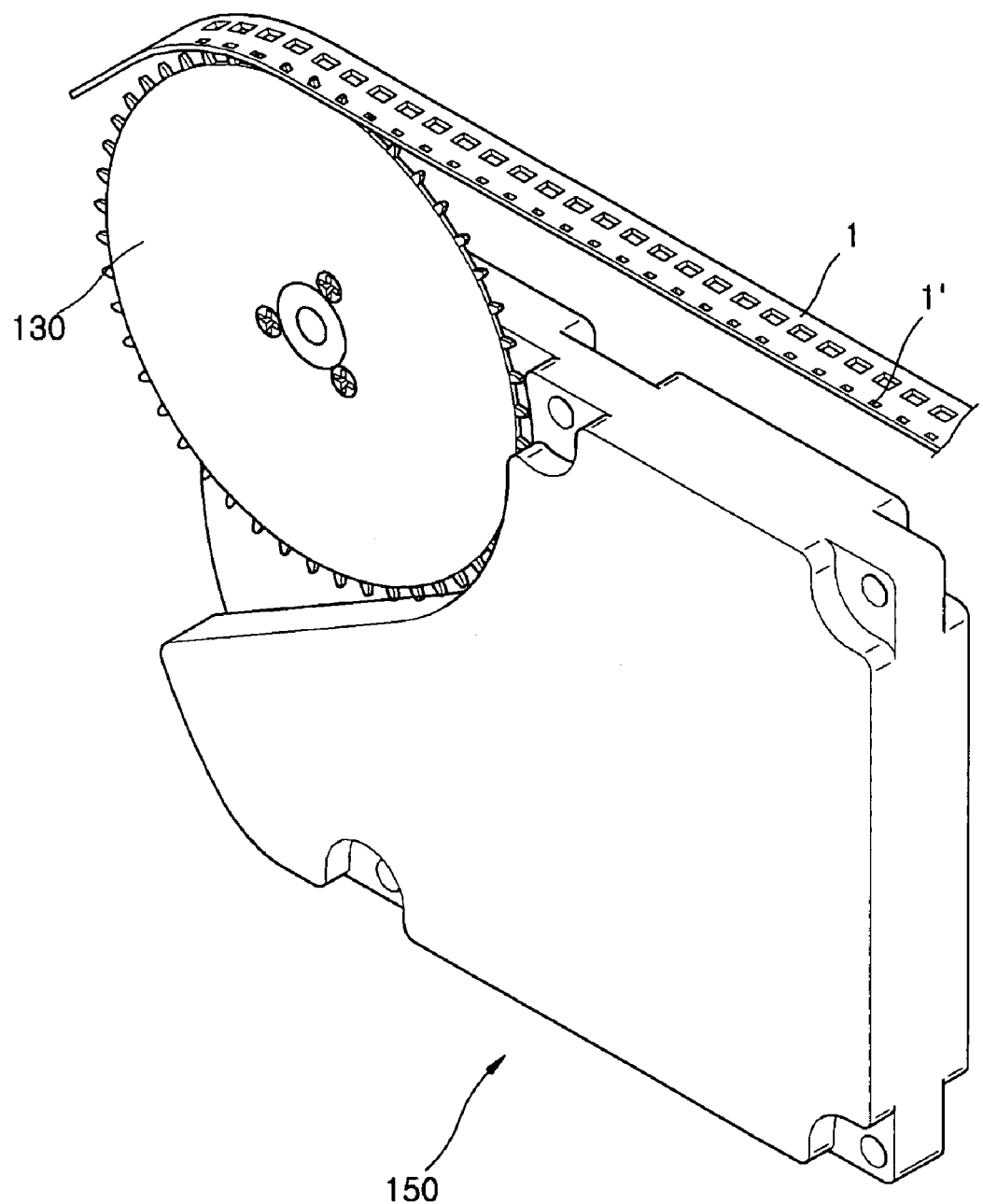
FIG. 4 is a first side perspective view of a tape feeding module for use in the exemplary tape feeder of FIGS. 2 and 3.
Figure 5:
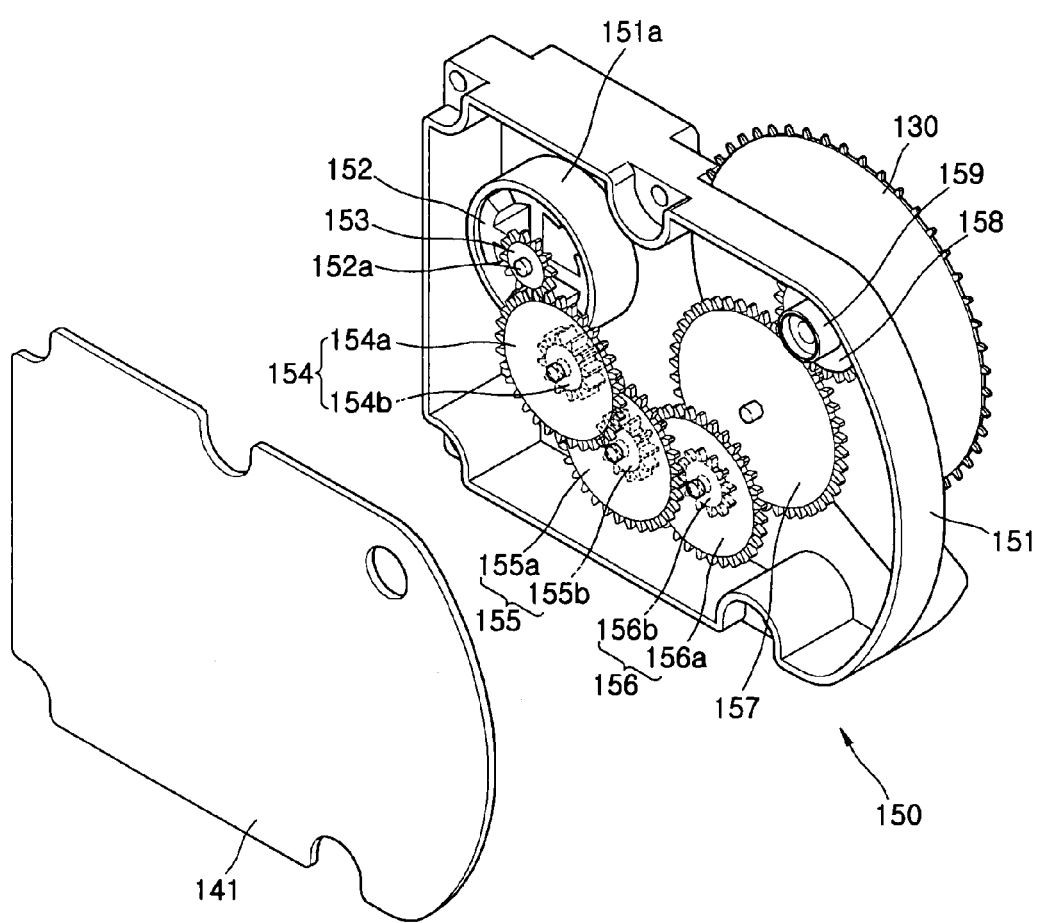
FIG. 5 is a second side perspective view of the tape feeding module of FIG. 4, partially exploded to show the general arrangement of internal components.

FIGS. 4 and 5 are perspective views illustrating two sides of the tape feeding module 150 according to an embodiment of the present invention. Referring to FIGS. 4 and 5, the tape feeding module 150 includes a module housing 151 and a sprocket 130 installed thereon. Further, the module housing 151 encloses a driving motor 152 installed at one part of the module housing 151, a mounting axis 159, which is distal from the driving motor 152, on which the sprocket 130 is mounted, and a transmission that connects a power axis 152a (i.e., shaft) of the driving motor 152 and the mounting axis 159 so that they are mutually linked. As shown in FIG. 5, the transmission comprises a meshed gear train including gears 154, 155, 156 and 157 in a series, but the transmission may be other transmission means known in the art such as a belt, chain, linkage or the like.

The driving motor 152 may be inserted in a motor recess 151a formed at one part of the module housing 151. A servomotor with an encoder (not shown) mounted thereon may be used as the driving motor 152, but other motors such as stepping motors may be employed as well. The amount of rotation of the driving motor 152 can be sensed by counting the number of pulse signals generated by the encoder according to the operation of the driving motor 152, and by servo-mechanism, the rotation of the driving motor 152 can be appropriately controlled.

A driving gear 153 coupled to the power axis 152a rotates according to the operation of the driving motor 152 and the rotating force of the driving gear 153 is transmitted to a mounting axis gear 158 via first, second, third, and fourth idle gears 154, 155, 156, and 157, respectively, that are meshed with each other to be mutually linked. As a result, when the driving motor 152 operates, the mounting gear 158 rotates to turn the mounting axis 159, thereby turning the sprocket 130. In more detail, when the driving gear 153 rotates, the first, second, and third idle gears 154, 155, and 156 that are sequentially coupled cooperate with one another to rotate the fourth idle gear 157. Then, the mounting axis gear 158 that is meshed with the fourth idle gear 157 rotates, and consequently, the mounting axis 159 together with the sprocket 130 also rotates. The first, second, and third idle gears 154, 155, and 156 may have different outer diameters, and may respectively include large gears 154a, 155a, 156a and small gears 154b, 155b, and 156b that are coaxial with the first, second, and third idle gears 154, 155, and 156. As can be appreciated the axes for the gears 154-157 may be integral with the housing 151 for supporting the gears, but the axes may alternatively be integral with the gears 154-157 and supported (e.g., journaled) by the module housing 151. The module housing 151 in which the driving motor 152 and the first, second, third, and fourth idle gears 154, 155, 156, and 157 are supported is sealed by a cover 141 to protect the components therein. The cover 141 may be removed to maintain or repair the internal components (e.g., motor 152) of the module 150. The sprocket 130 is supported by the mounting axis 159 and teeth are formed on the outer circumference of the sprocket 130. As shown in FIG. 4, the tape 1 has a predetermined pitch that corresponds with the pitch of the teeth on the sprocket 130. That is, the sprocket teeth are sequentially inserted into a plurality of feeding holes 1' formed in a line on the tape 1 to advance the tape 1.

Figure 6:
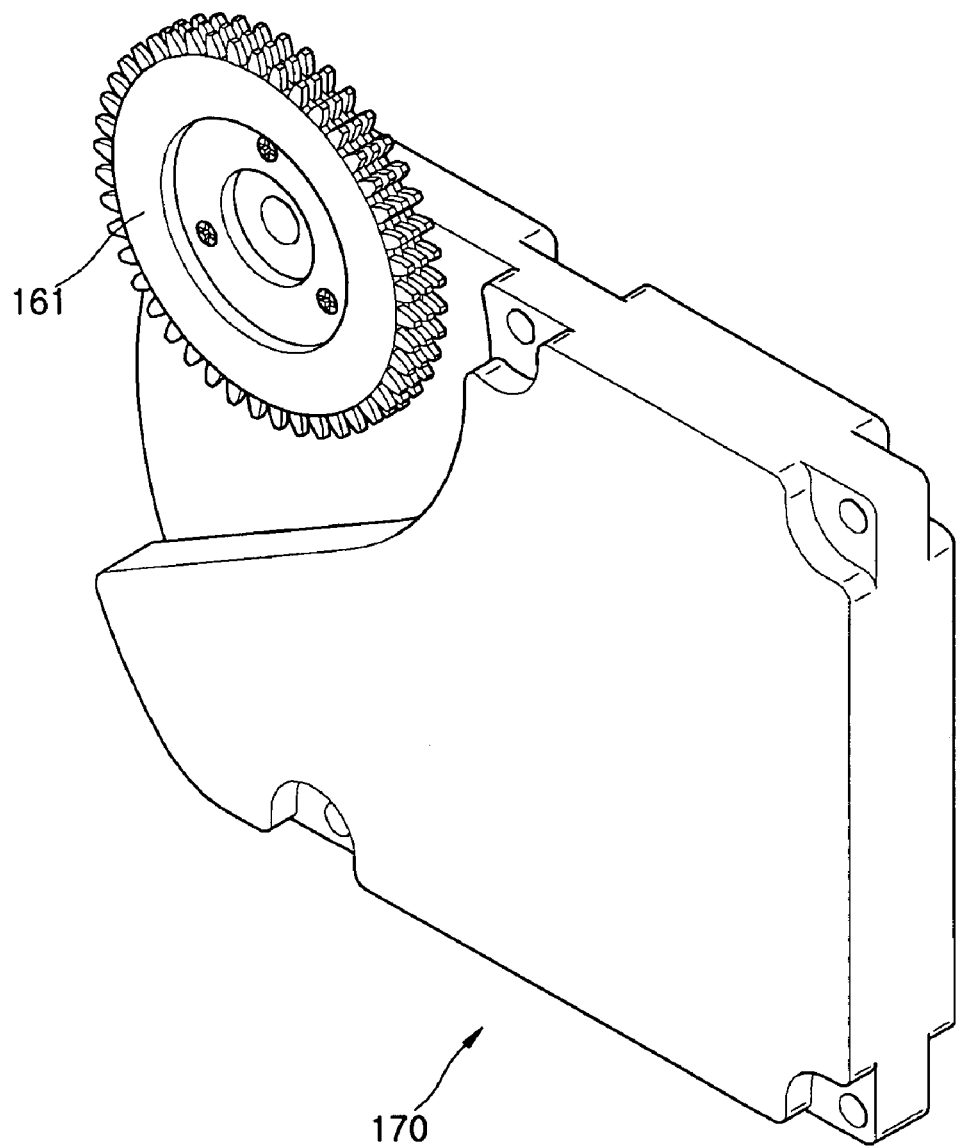
FIG. 6 is a first side perspective view of a recovering module for use in the exemplary tape feeder of FIGS. 2 and 3.
Figure 7:
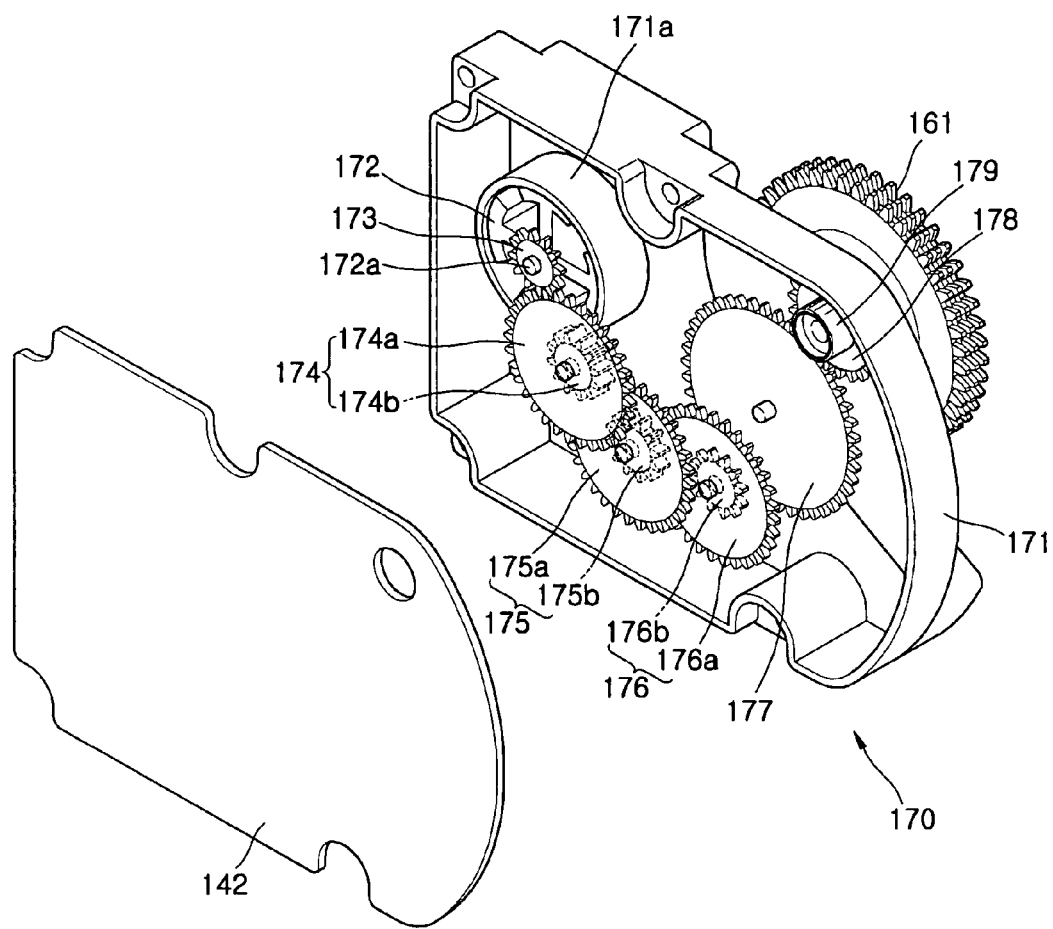
FIG. 7 is a second side perspective view of the recovering module of FIG. 6, partially exploded to show the general arrangement of internal components.

FIGS. 6 and 7 are perspective views illustrating two sides of the recovering module 170 according to an embodiment of the present invention. Referring to FIG. 7, the recovering module 170 includes a module housing 171 and a first recovering gear 161 mounted thereon. Further, the module housing 171 encloses a driving motor 172 mounted on one part of the module housing 171, a mounting axis 179 that is disposed at another part of the module housing 171 distal from the driving motor 172 and on which the first recovering gear 161 is mounted, and a transmission that transfers power between a power axis 172a (i.e., shaft) of the driving motor 172 and the mounting axis 179 so that they are mutually linked. As shown in FIG. 7, the transmission comprises a meshed gear train including gears 174, 175, 176 and 177 in a series, but the transmission may be other transmission means known in the art such as a belt, chain, linkage or the like. The gear train includes a driving gear 173 coupled to the power axis 172a, first, second, third and fourth idle gears 174, 175, 176, and 177, respectively, that are meshed with one another, and a mounting axis gear 178 that is coupled to the mounting axis 179. The first, second, and third idle gears 174, 175, and 176 may have different outer diameters and may respectively include large gears 174a, 175a, 176a and small gears 174b, 175b, 176b that are coaxial with the respective first, second, and third idle gears 174, 175, and 176.

The driving motor 172 can be inserted in a motor recess 171a formed at one part of the module housing 171. As with the driving motor 152 of the tape feeding module 150, a servomotor with an encoder (not shown) mounted thereon may be used as the driving motor 172, but other motors such as stepping motors may be employed as well. The amount of rotation of the driving motor 172 can be sensed by counting the number of pulse signals generated by the encoder according to the operation of the driving motor 172, and by servo-mechanism and feedback control, the rotation of the driving motor 172 can be appropriately controlled and adjusted. The driving gear 173 coupled to the power axis 172a rotates according to the operation of the driving motor 172. The rotation power of the driving gear 173 is transmitted to the mounting axis gear 178 via the first, second, third, and fourth idle gears 174, 175, 176, and 177, which are meshed with one another to be mutually connected, thereby rotating the mounting axis 179 and consequently, the first recovering gear 161 coupled to the mounting axis 179. When the first recovering gear 161 rotates, the second recovering gear 162 (see FIG. 2), which is meshed with the first recovering gear 161, rotates in the opposite direction, and the top cover 3 is discharged from the tape feeder by passing between the first and second recovering gears 161, 162. The module housing 171 may be sealed by a cover 142 to protect the components within the housing 171. The cover 142 may be removed to maintain or repair the internal components (e.g., motor 172) of the module 170.

In the present embodiment, the tape feeding module 150 and the recovering module 170 have modular constructions to facilitate assembly and repair of the tape feeder. Since the tape feeding module 150 and recovering module 170 are modular the number of manhours for assembling the tape feeding module 150 and recovering module 170 and manufacturing costs thereof can be reduced. In addition, the structure of the tape feeding module 150 and the recovering module 170 does not need to be changed according to the type of the tape feeder or the width of the tape 1 relative to the size of the electronic components that are supplied. That is, the same tape feeding module 150 and recovering module 170 can be employed or retrofit in many tape feeders.

In one exemplary embodiment, the tape feeding module 150 and the recovering module 170 may have substantially the same structure, as can be appreciated by comparing FIGS. 5 and 7. That is, although the tape feeding module 150 and the recovering module 170 are described herein individually, the modules may have substantially the same structure except that the sprocket 130 is mounted on the mounting axis 159 of the tape feeding module 150 to feed the tape 1, whereas the recovering gear 161 is mounted on the mounting axis 179 of the recovering module 170 to discharge the top cover 3.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A tape feeder that removes a top cover attached to a top surface of a tape storing a plurality of electronic components while feeding the tape in a predetermined pitch so that the electronic components are sequentially picked up by a mounting head, the tape feeder comprising:

a frame;

a first top cover-engaging gear coupled with the frame;

a first module that is removably mounted on a first portion of the frame that is distal from the first top cover-engaging gear for feeding the tape in a first direction, the first module including a first housing, a first driving motor enclosed by the first housing, a first output shaft projecting through a portion of the first housing distal from the first driving motor, a tape-feeding gear coupled with the first output shaft outside the first housing for meshing with the tape, and a first transmission that enclosed by the housing, the first transmission coupling a shaft of the first driving motor to the first output shaft; and a second module that is removably mounted on a second portion of the frame distal from the first portion and proximate to the first top cover-engaging gear, the second module including a second housing, a second driving motor enclosed by the second housing, a second output shaft projecting through a portion of the second housing distal from the second driving motor, a second top cover-engaging gear coupled with the second output shaft outside the second housing for cooperating with the first top cover-engaging gear to discharge the top cover from the tape feeder, and a second transmission enclosed by the second housing, the second transmission coupling a shaft of the second driving motor to the second output shaft.

2. The tape feeder of claim 1 wherein the first and second modules are substantially similar.

3. The tape feeder of claim 1 wherein the first transmission comprises a first gear train.

4. The tape feeder of claim 3 wherein the first gear train comprises at least one idle gear including a large gear and a small gear that are coaxially coupled on a rotating axis.

5. The tape feeder of claim 3 wherein the second transmission comprises a second gear train.

6. The tape feeder of claim 5 wherein the second gear train comprises at least one idle gear including a large gear and a small gear that are coaxially coupled on a rotating axis.

7. The tape feeder of claim 1 wherein the first driving motor comprises a servomotor including an encoder that senses a rotation speed of the servomotor.

8. The tape feeder of claim 7 wherein the second driving motor comprises a servomotor including an encoder that senses a rotation speed of the servomotor.

* * * * *